United States Patent
Valka et al.

(10) Patent No.: US 9,377,793 B2
(45) Date of Patent: Jun. 28, 2016

(54) ADAPTIVE VOLTAGE SCALING MECHANISM BASED ON VOLTAGE SHOOT MEASUREMENT

(71) Applicant: ST-Ericsson SA, Plan-les-Ouates (CH)

(72) Inventors: Miroslav Valka, La Verpilliere (FR); Alberto Bosio, Montpellier (FR); Philippe Debaud, St. Martin d'Uriage (FR); Patrick Girard, Villetelle (FR); Stephane Guilhot, Herbeys (FR)

(73) Assignee: ST-ERICSSON SA, Plan-les-Ouates (CH)

( * ) Notice: Subject to any disclaimer, the term of this patent is extended or adjusted under 35 U.S.C. 154(b) by 0 days.

(21) Appl. No.: 14/415,780

(22) PCT Filed: Aug. 8, 2013

(86) PCT No.: PCT/EP2013/066669
§ 371 (c)(1),
(2) Date: Jan. 20, 2015

(87) PCT Pub. No.: WO2014/023812
PCT Pub. Date: Feb. 13, 2014

(65) Prior Publication Data
US 2015/0177751 A1    Jun. 25, 2015

Related U.S. Application Data

(60) Provisional application No. 61/714,160, filed on Oct. 15, 2012.

(30) Foreign Application Priority Data

Aug. 8, 2012    (EP) .................................. 12305985

(51) Int. Cl.
*G05F 1/10*    (2006.01)
*G06F 1/32*    (2006.01)
(Continued)

(52) U.S. Cl.
CPC ............ *G05F 1/10* (2013.01); *G01R 31/31709* (2013.01); *G06F 1/26* (2013.01);
(Continued)

(58) Field of Classification Search
CPC .......... G06F 1/26; G06F 1/324; G06F 1/3296; G06F 11/3062
See application file for complete search history.

(56) References Cited

U.S. PATENT DOCUMENTS

| 7,487,055 | B2 | 2/2009 | Le-Gall | |
|---|---|---|---|---|
| 8,198,930 | B2 * | 6/2012 | Zerbe | G06F 1/10 327/158 |
| 2012/0146539 | A1 * | 6/2012 | Riesebosch | H05B 33/089 315/291 |

FOREIGN PATENT DOCUMENTS

| WO | 03/062972 A2 | 7/2003 |
|---|---|---|
| WO | 2008/015495 A1 | 2/2008 |
| WO | 2014/023811 A1 | 2/2014 |

OTHER PUBLICATIONS

Chakravarty, Sreejit et al., "Optimal Manufacturing Flow to Determine Minumum Operating Voltage," 2011 IEEE International Test Conference (ITC), Sep. 20-22, 2011, pp. 1-10, Anaheim, CA, Print ISBN: 978-1-4577-0153-5.

(Continued)

*Primary Examiner* — Jeffrey Zweizig
(74) *Attorney, Agent, or Firm* — Patent Portfolio Builders PLLC

(57) ABSTRACT

A device for controlling a power supply for a functional block in an integrated circuit, the device comprising: a signal generator configured to provide a clock signal to the functional block, an antenna comprising a transistor, and being located proximate to the functional block, the antenna being configured to receive the clock signal from the signal generator, and wherein the transistor of the antenna receives electrical power from the same power source that delivers power to the functional block, means to measure the clock signal output from the antenna, and output a control signal, and feedback means to control the voltage of the power supply to the functional block on the basis of the control signal.

15 Claims, 8 Drawing Sheets

(51) Int. Cl.
*G06F 11/30* (2006.01)
*G06F 1/26* (2006.01)
*G01R 31/317* (2006.01)

(52) U.S. Cl.
CPC ............ *G06F 1/324* (2013.01); *G06F 1/3296* (2013.01); *G06F 11/3013* (2013.01); *G06F 11/3062* (2013.01); *G06F 11/3093* (2013.01); *Y02B 60/1217* (2013.01); *Y02B 60/1285* (2013.01)

(56) References Cited

OTHER PUBLICATIONS

Sunter, Stephen, et al., "On-Chip Digital Jitter Measurement, from Megahertz to Gigahertz," IEEE Design & Test Computers, vol. 21, No. 4, Jul. 1, 2004, pp. 312-321, XP055085079, ISSN: 0740-7475, DOI: 10.1109/MDT.2004.38.

Huang, Jui-Jer, et al., "A Low-Cost Jitter Measurement Technique for BIST Applications," Proceedings of the 12th Asian Test Symposium (ATS '03), IEEE, Piscataway, NJ, USA, Nov. 16-19, 2003, pp. 336-339; XP010672509; DOI: 10.1109/ATS.2003.1250833; ISBN: 978-0-7695-1951-7.

Horowitz, Mark, et al., "Low-Power Digital Design," IEEE Symposium on Low Power Electronics, 1994, pp. 8-11.

European application No. 12305986.7 filed Aug. 8, 2012.

International Search Report issued in corresponding International application No. PCT/EP2013/066669, date of mailing of the report Oct. 18, 2013.

Kaul, Himanshu, et al., "DVS for On-Chip Bus Designs Based on Timing Error Correction," Proceedings of the Design, Automation and Test in Europe Conference and Exhibition (Date '05), Munich, Germany, Mar. 7-11, 2005, IEEE, pp. 80-85, XP010779930, ISBN: 978-0-7695-2288-3.

Dhar, Sandeep, et al., "Closed-Loop Adaptive Voltage Scaling Controller for Standard-Cell ASICs," 2002 Proceedings of the International Symposium on Low Power Electronics and Design, ISLPED '02, Aug. 12-14, 2002, pp. 103-107, XP010600859, ISBN: 978-1-58113-475-9.

ITRS; "The International Technology Roadmap for Semiconductors, 2011 Edition, Executive Summary"; 2011; pp. 1-98.

* cited by examiner

ADAPTIVE VOLTAGE SCALING MECHANISM BASED ON VOLTAGE SHOOT MEASUREMENT

BACKGROUND

1. Technical Field

The present application generally relates to fine-tuning techniques for power supplies, the techniques are based on voltage drop measurements, and find use in, for example, System-on-a-Chip (SoC) architectures for mobile applications.

The techniques also find applications in mobile devices, such as mobile (cell) phones, smart phones, tablets, laptops, etc.

2. Related Art

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section.

Power consumption has become a key factor in determining the limits of the performance of integrated circuits, especially in respect of devices intended for use in mobile devices.

Generally, in integrated circuits for use in mobile devices, such as smart-phones, tablets and laptops, there is a trade-off between the battery-life and the processing performance of the integrated circuit. This is because an increase in processing performance will typically result in an increase in the power consumption, and hence a reduction in the lifetime of the battery that is used to power the circuit.

To address this issue, the power consumption for a given processing performance can be improved by adopting low power integrated circuit designs, for example by adopting technology that allows circuits to operate at a low voltage. As disclosed in [ITRS 2011, http://www.itrs.net/home.html], very low power design (VLPD) technology, employs methods to both reduce the power consumption and also a system of power-tuning that depends on the desired performance. Thus, for example, the power supplied to an integrated circuit using VLPD can be adjusted to suit the processing that the circuit is currently carrying out (i.e., dependent on the application that is being executed).

A further method of reducing power consumption is the Dynamic Voltage Frequency Scaling (DVFS) approach. This is described, for example, in [M. Horowitz, T. Indermaur, and R. Gonzalez, "Low-power digital design," IEEE Symp. On Low Power Electronics, 1994, pp. 8-11].

DVFS technology employs pre-defined operating conditions (OPs) which scale the supplied voltage and frequency dependent on the needs of the current OPs. DVFS employs predefined fixed values of the voltage and frequency for different OPs, and so the power cannot generally be fine-tuned depending on the particular application that is running.

To improve the accuracy of the power-tuning, a closed loop control system called Adaptive Voltage Scaling (AVS) approach has been proposed in [S. Dhar, D. Maksimovic, and B. Kranzen, "Closed-loop adaptive scaling controller for standard-cell ASICS," ISLPED 2002, pp 0.103-107]. This technique permits continuous adaptation of the supplied voltage/frequency via the closed loop control. However, the level of accuracy achieved is dependent on the accuracy of the measurement of the actual power consumption.

The process monitoring box (PMB) disclosed in [Chakravarty S., et al, "Optimal Manufacturing Flow to Determine Minimum Operating Voltage", Electronic Design, Monterey, Calif., Aug. 12-14, 2002, pp. 103-107, [ITC 2011, pp. 1-10]] can be used to determine the optimal operating voltage in a production flow. PMB is represented as a ring oscillator, whose output is used as the clock of a counter. This counter counts for a fixed length of time and that count can be read out as a value, C. C is used as a correlation factor to determine the optimal operating conditions. PMB based predictions of die parameters are strongly dependent on the number of stages used in the ring oscillator. Therefore, a compensation factor has to be added into the correlation factor.

In [S. Dhar, D. Maksimovic, and B. Kranzen, "Closed-loop adaptive scaling controller for standard-cell ASICS," ISLPED 2002, pp 0.103-107], a voltage supply regulation scheme based on embedded delay line is disclosed. The controller is composed of delay line elements, level shifters and capture elements (flip-flops). The controller allows a fast transient response to step changes in speed, and also allows operation over a range of system clock frequencies. However, this solution suffers from low precision in terms of power supply noise consideration, when activity in the circuit is present, due to the reduced controller operating frequency that is employed.

A European patent application EP12305986.7, filed on the same day as this application by the applicant, Valka, M. et al., "Efficient Power Measurement Based on Timing Uncertainty," C03195, 8 Aug. 2012, ST-Ericsson SA discloses a method of measuring power supply noise in an integrated circuit based on a timing uncertainty in a clock signal. This application is not prior art for the present application, and the power supply noise measurement device and method disclosed therein is employed in the present application as part of a voltage control system. Accordingly, document EP12305986.7 is herein incorporated by reference in its entirety.

SUMMARY

In a first aspect, there is provided a device for controlling a power supply for a functional block in an integrated circuit, the device comprising: a signal generator configured to provide a clock signal to the functional block, an antenna comprising a transistor, and being located proximate to the functional block, the antenna being configured to receive the clock signal from the signal generator, and wherein the transistor of the antenna receives electrical power from the same power source that delivers power to the functional block, means to measure the clock signal output from the antenna, and output a control signal, and feedback means to control the voltage of the power supply to the functional block on the basis of the control signal.

Thus, by examining the transmission of a clock signal through a transistor powered by the power supply, there is provided a means of controlling an output voltage of the power supply for the function block on the basis of a parameter that is closely representative of the performance of the functional block.

In some embodiments, the antenna comprises a buffer, the buffer comprising a plurality of transistors configured to relay the clock signal from an input of the buffer to an output of the buffer. Thus, the antenna can be formed easily from well-known components.

In some embodiments the antenna comprises a plurality of buffers electrically connected in a daisy-chain fashion, whereby the output of buffers in the daisy-chain are connected to the input of the subsequent buffer in the daisy-chain. Thus, an antenna of arbitrary length can be created by connecting together a plurality of buffers.

In some embodiments, the power to the, or each, transistor in the antenna is taken from a mesh of electrical contacts that also provides electrical power to components within the functional block. By receiving electrical power in this manner, it can be ensured that the elements of the antenna directly measure the power supply noise that is experienced by components within the integrated circuit, thereby providing an accurate result.

In some embodiments, the means to measure the clock signal comprises a jitter estimator, which is configured to measure timing errors between the clock signal output from the antenna and a reference clock signal. Thus a parameter that is relatively simple to measure can be employed.

In some embodiments, the functional block, antenna and means to measure the clock signal are all located within a voltage domain, and wherein a common power source supplies power to the voltage domain. Thus, by employing a system of voltage domains many of the components of the noise measurement device can be powered by the same power source. As a result, these components can be powered down when the functional block under test is also powered down.

In some embodiments, the antenna is formed as a part of the functional block. Thus, the antenna can be located within the circuit under test to enable the most accurate measurement of the power supply voltage.

In some embodiments, the feedback means is configured to increase the voltage output from the power supply to the functional block if the measured timing error is above a reference timing error, and to decrease the voltage output from the functional block if the measured timing error is below the reference timing error. Thus, control of the power supply voltage to a desired operating parameter of the functional block can be achieved.

In some embodiments, the reference timing error is determined by measuring the timing error from the antenna resulting from running a reference instruction set in the functional block. Thus, the reference can be set on the basis of actually observed timing errors in known conditions.

In some embodiments, a multiplexer is employed, wherein the multiplexer is configured to selectably transfer either the clock signal from the signal generator, or the signal output from the antenna, to the jitter estimator. Thus, the device can permit calibration of the signal from the antenna by comparison with the signal from the signal generator.

In some embodiments, the feedback means is configured to provide feedback during execution of processing instructions on the functional block. Thus, this enables maintenance of the power supply voltage at the minimum level that results in the timing error from the antenna being equal to the reference timing error.

In a second aspect, there is provided a method for controlling a power supply for a functional block in an integrated circuit, the method comprising: providing a clock signal to the functional block, providing detection means comprising a transistor, located proximate to the functional block, the detection means being configured to receive the clock signal, and wherein the transistor of the detection means receives electrical power from the same power source that delivers power to the functional block, measuring the clock signal output from the detection means, and outputting a control signal, and providing feedback to control the voltage of the power supply to the functional block on the basis of the control signal.

Further aspects are provided by a computer program product for performing the method of the second aspect, and a computer readable medium comprising such a computer program product.

BRIEF DESCRIPTION OF THE DRAWINGS

The present invention is illustrated by way of example, and not by way of limitation, in the Figures of the accompanying drawings, in which like reference numerals refer to similar elements and in which.

DESCRIPTION OF PREFERRED EMBODIMENTS

Embodiments will be described below by way of example in the context of a System-on-Chip (SoC) architecture for mobile applications. However, the skilled reader will appreciate that the embodiments can equally be applied in other situations, including applications that employ an integrated circuit device, and any application in which the power supply noise in the circuit is at issue.

Figure 1:
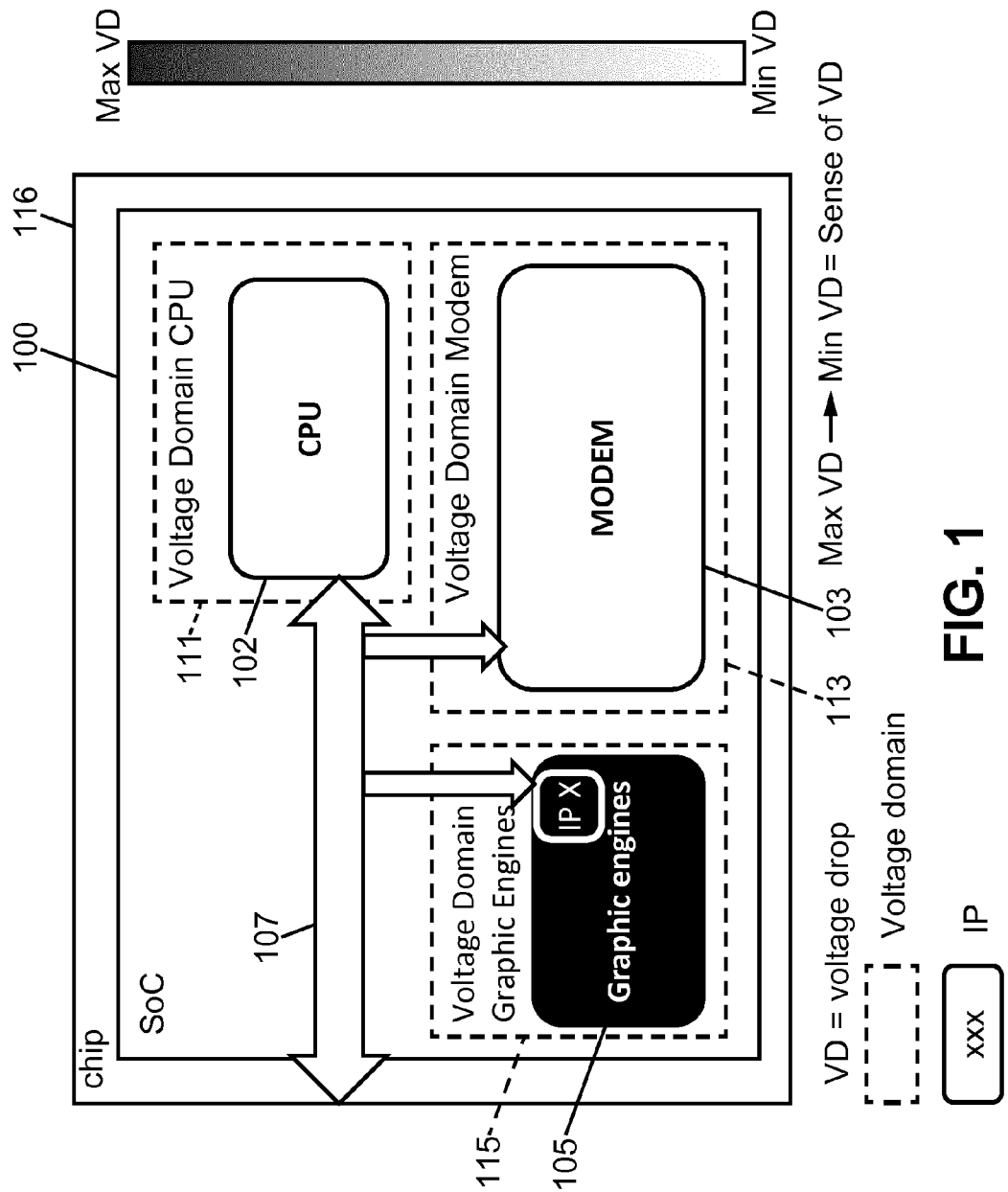
FIG. 1 is a schematic view of an example of an integrated circuit composed of three functional blocks.

A typical SoC integrated circuit is composed of a plurality of functional blocks (IPs), each of which can be placed on different power/voltage domains. FIG. 1 illustrates a schematic view of an example of a SoC, shown generally as 100, formed on an integrated circuit 116 and composed of three functional blocks. The skilled person will recognise that the embodiments can equally be applied to SoCs having a greater or lesser number of functional blocks.

In the example shown in FIG. 1, these functional blocks are a Central Processing Unit (CPU) 102, a Graphical processing Unit (GPU) 105 and a MODEM 103. Each functional block 102, 103, 105 may have its own operating conditions, such as the particular power supply voltage (Vdd) and operating frequency (Freq). This is illustrated in FIG. 1 by the different voltage domains in which the components are located. Thus, the CPU 102 is located in a first voltage domain 111, while the GPU 105 and MODEM 103 are similarly located in separate voltage domains 115 and 113 respectively. Each of the different voltage domains 111, 113, 115 can be supplied with different voltages and/or clock frequencies dependent on the current needs of the functional block or blocks within the domain. In addition, if a particular functional block is not required at a given time, then the voltage supplied to the respective domain can be switched to zero to thereby save power. In FIG. 1, interconnections 107 are also shown between the CPU 102, GPU 105 and MODEM 103, these are for the transmission of data signals between the functional blocks.

The skilled person will recognise that the power consumed by a functional block can vary over time, dependent on the particular processing task or application that the functional block us undertaking. The power consumed is generally a function of the switching activity of the functional block. Thus, in general, if the switching activity of a functional block is high, then the power consumption will tend to be high.

Similarly, low switching activity tends to result in a low power consumption for the functional block.

The skilled person will also recognise that the consumption of power by a functional block will result in a drop in the power supply voltage. To illustrate this, FIG. 1 shows as an example that the MODEM 103 is currently in a situation of low switching activity, and therefore low voltage drop, as is indicated by the shading of the MODEM 103 with reference to the scale to the right of the Figure. In contrast, the CPU 102 is in a state of medium activity (medium voltage drop), while the GPU 105 is in a state of high activity (high voltage drop). Moreover, and as shown by the gradient in the shading illustrated on the CPU 102 and the MODEM 103, the activity level varies spatially within these functional blocks. This can be, for example, because the current activity of the functional block is higher for some particular area of circuitry. Thus, the voltage drop can vary both between functional blocks and also spatially within a functional block.

A reduction in the effective supply voltage to a functional block can lead to a reduction in the performance of the circuit in the functional block. This reduction in performance can, for example, manifest itself in the form of timing errors in signals within, or output from, the functional block. Thus, there is a direct relationship between noise in the power supply, for example caused by varying activity in a functional block varying the effective supply voltage, and timing errors observed in clock signals within the functional block.

Accordingly, in an embodiment, there is provided a system including a sensor to detect the power supply noise (PSN) within a functional block by detecting the presence of such timing errors. The system further comprises a feedback means to provide feedback to the power supply to control the output voltage of the power supply on the basis of the PSN.

Figure 2:
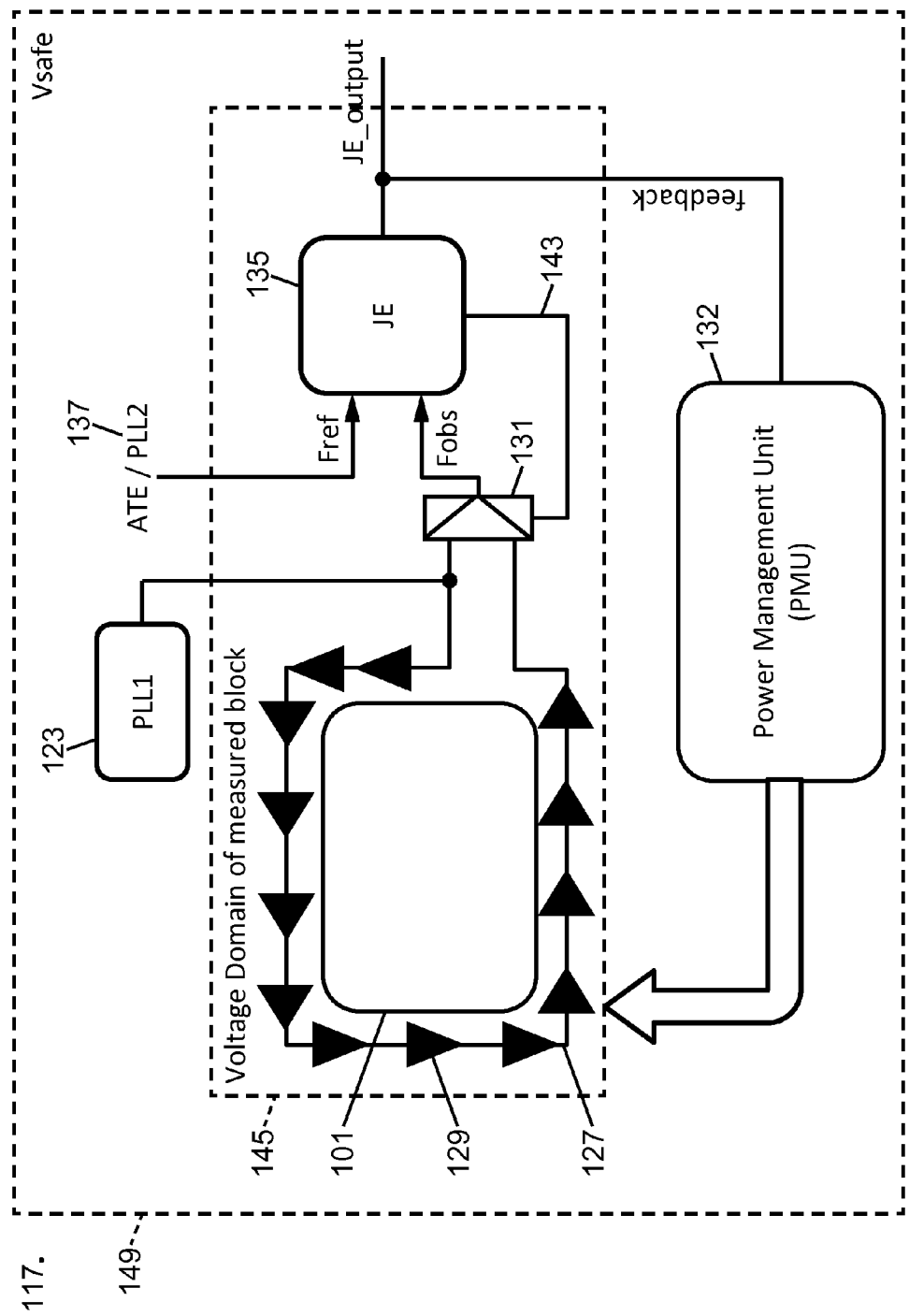
FIG. 2 is a schematic block diagram of a power supply control system according to an embodiment.

FIG. 2 illustrates an embodiment employing an Adaptive Voltage Scaling (AVS) closed loop for controlling the power supply to a functional block, which is illustrated by way of example as a CPU 101. The CPU 101 is located on an integrated circuit shown generally as 117. The integrated circuit 117 also has a first phase-locked loop (PLL) 123. This generates a clock signal for the CPU 101 using a crystal oscillator. The generation of such clock signals is well known in the art, and so a further explanation will not be included here. The output from the first PLL 123 is electrically connected to the CPU 101 such that the clock pulses from the first PLL 123 can be used as a timing signal for the CPU 101 in a usual, known, manner.

Surrounding the CPU 101 is an antenna 127. The antenna 127 comprises a series of buffers 129 (for clarity not all of the buffers are labelled) connected in a daisy chain fashion. The antenna 127 is physically located as close as possible to the CPU 101 so as to enable the most accurate sensing of the noise parameters. In the presently described embodiment, the buffers 129 that comprise the antenna are located outside of the CPU 101. However, in alternative embodiments, the buffers 129 are included within the circuitry of the CPU 101. Clearly, such an embodiment involves implementation of the described embodiment during the design phase of the CPU 101. In contrast, implementation of the presently described embodiment can be achieved at the design phase of the integrated circuit 117, and so the design of the CPU 101 need not be altered from a known design.

The structure of the antenna 127 and buffers 129 will be described in further detail below with reference to FIGS. 3 and 4. One end of the antenna 127 is electrically connected to the clock signal from the first PLL 123, while the other end of the antenna 127 is connected to an input of a multiplexer 131. Thus, the clock signal from the first PLL 123 forms an input to the antenna 127 and, having passed through each buffer 129 that forms the antenna 127, the (potentially modified) clock signal is output to the multiplexer 131. In addition, the clock signal from the first PLL 123 is connected to a second input of the multiplexer 131.

The multiplexer 131 is configured to selectably output either the clock signal from the first PLL 123, or the clock signal that has passed through the antenna 127. The output from the multiplexer 131 is electrically connected to a first input of a jitter estimator (JE) 135. The JE will be described in greater detail with reference to FIG. 4.

The JE 135 has a second 137 input via which a reference clock signal, $F_{ref}$, is received. The reference clock signal is provided either by another PLL (not shown) on the integrated circuit 117, or via external equipment such an automatic test equipment (ATE).

The JE 135 has an output that is electrically connected to a power management unit (PMU) 132, which provides feedback to the integrated circuit in the form of control of the power supply voltage. Further description of the PMU is provided below. Additionally, the JE 125 has a control output 141 which provides a control signal to the multiplexer 131 to enable selection of the desired signal to be output to the JE 135.

The integrated circuit 117 is divided into voltage domains, wherein all components within a given domain are supplied electrical power from the same source, and so operate at the same voltage. As a result, components with a voltage domain will also therefore tend to experience the same voltage fluctuations resulting from power supply noise. The skilled user will be familiar with the concept of voltage domains, and so a detailed explanation will not be provided here. In the integrated circuit 117, the CPU 101, the antenna 127, the multiplexer 131 and the JE 135 are all located in a first voltage domain 145. The remaining components, including the PLL 123 and the PMU 132 are all in a further voltage domain 149.

Figure 3:
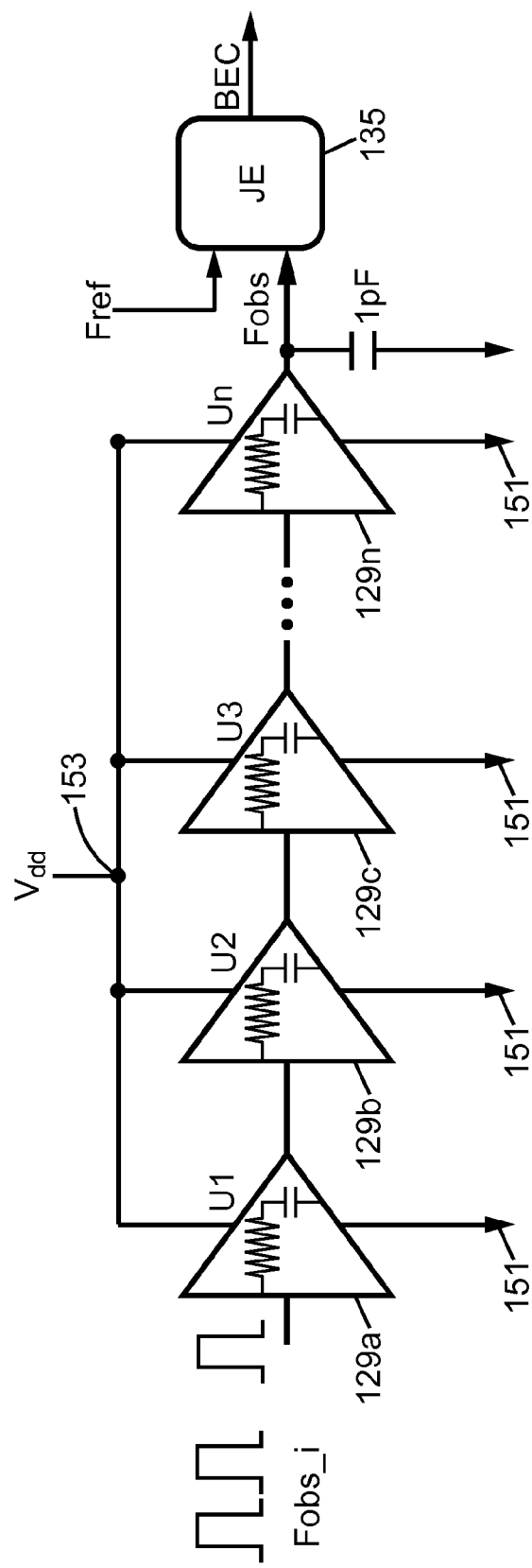
FIG. 3 illustrates details of an antenna of the embodiment of FIG. 2.

FIG. 3 illustrates further details of the antenna 127. As noted above, the antenna 127 is comprised of a chain of substantially identical buffers 129 connected in a daisy chain fashion. Thus, the output of the first buffer in the chain 129a forms the input to the second buffer 129b, the output of which in turn forms the input to the third buffer 129c. The input to the first buffer 129a is provided by the clock signal from the first PLL 123, while the output to the last buffer in the chain 129n is used as an input to the first multiplexer 131. Power for each buffer 129a-n in the chain is supplied by connections between ground 151 and the voltage supply (Vdd) 153 in the voltage domain 145 that is local to the CPU 101. Thus, each buffer 129a-n in the chain is powered by a voltage that is directly representative of the voltage supply that is local to the part of the CPU 101 to which it is adjacent. Accordingly, each buffer 129a-n provides a means of detecting the supply voltage for the CPU 101 in its local area. Also shown in FIG. 4 are the effective parasitic capacitance and resistance arising from each buffer 129, these will be described in greater detail with reference to FIG. 4.

The skilled person will recognise that there is no particular limit on the number of buffers 129 that can be daisy-chained in this manner to form an antenna 127. Therefore, antennas of arbitrary length can be generated using such buffers 129.

Figure 4:
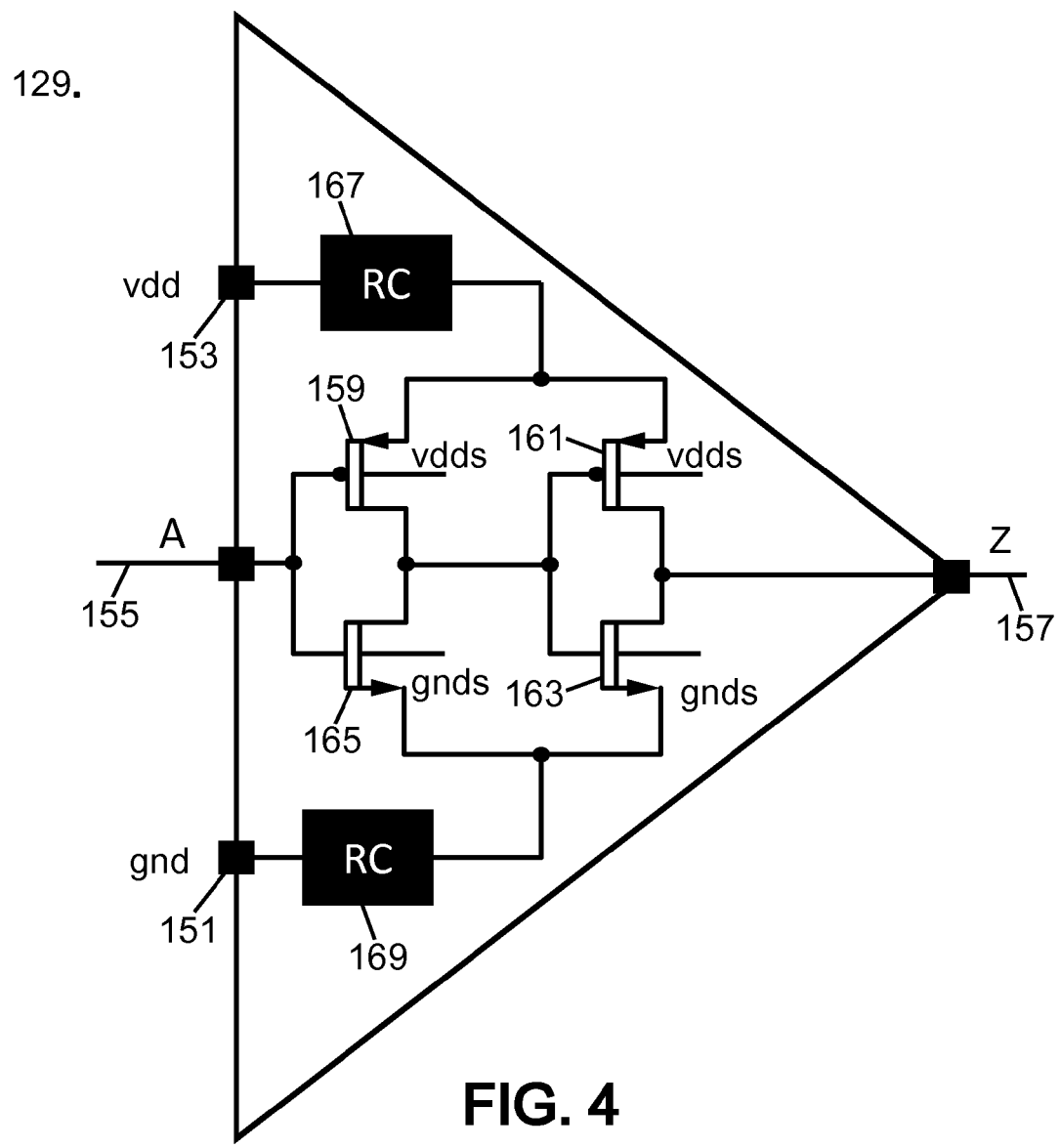
FIG. 4 illustrates details of a buffer that forms a part of the antenna of FIG. 3.

FIG. 4 illustrates further details of each buffer 129a-n, each of which is substantially identical. Each buffer comprises two pMOS transistors 159, 161 and two nMOS transistors 163, 165. The gate terminals of a first nMOS 165 and a first pMOS 159 are electrically connected to an input 155 to the buffer 129. The drain terminals of each of the first nMOS 165 and the first pMOS 159 are electrically connected to the gate terminals of the second nMOS 163 and the second pMOS 161, which are electrically connected together.

The source terminals of the first 159 and second 161 pMOS are connected to the supply voltage (Vdd) 153, while the drain terminals of the first 165 and second 163 nMOS are connected to ground 151. The output 157 to the buffer 129 is electrically connected to the drain terminals of both the second pMOS 161 and the second nMOS 163.

Also shown in FIG. 4 are effective parasitic RC circuits that exist between the supply voltage 153 and the source terminals of the first 159 and second 161 pMOS, and also between the ground 151 and the drain terminals of the first 165 and second 163 nMOS. The RC circuits in each buffer contribute to the jitter, and effectively increase the magnitude of the jitter.

The skilled person will recognise that the action of the circuit formed in the buffer 129 is to switch the output 157 high when the input 155 is switched high, and to switch the output 157 low when the input 155 is switched low. Thus, this is the usual action of a buffer circuit. The skilled person will also recognise that some delay will occur between the switching of the input 155 and the resulting switching of the output 157. This delay will depend on many factors, such as the particular transistors used and their configuration, the ambient temperature, and also the particular supply voltage to the transistors. Thus, under circumstances where all other parameters that affect the switching time of the buffer 129 are held approximately constant, the switching time of the buffer 129 can be used to sense the power supply voltage.

Figure 5:
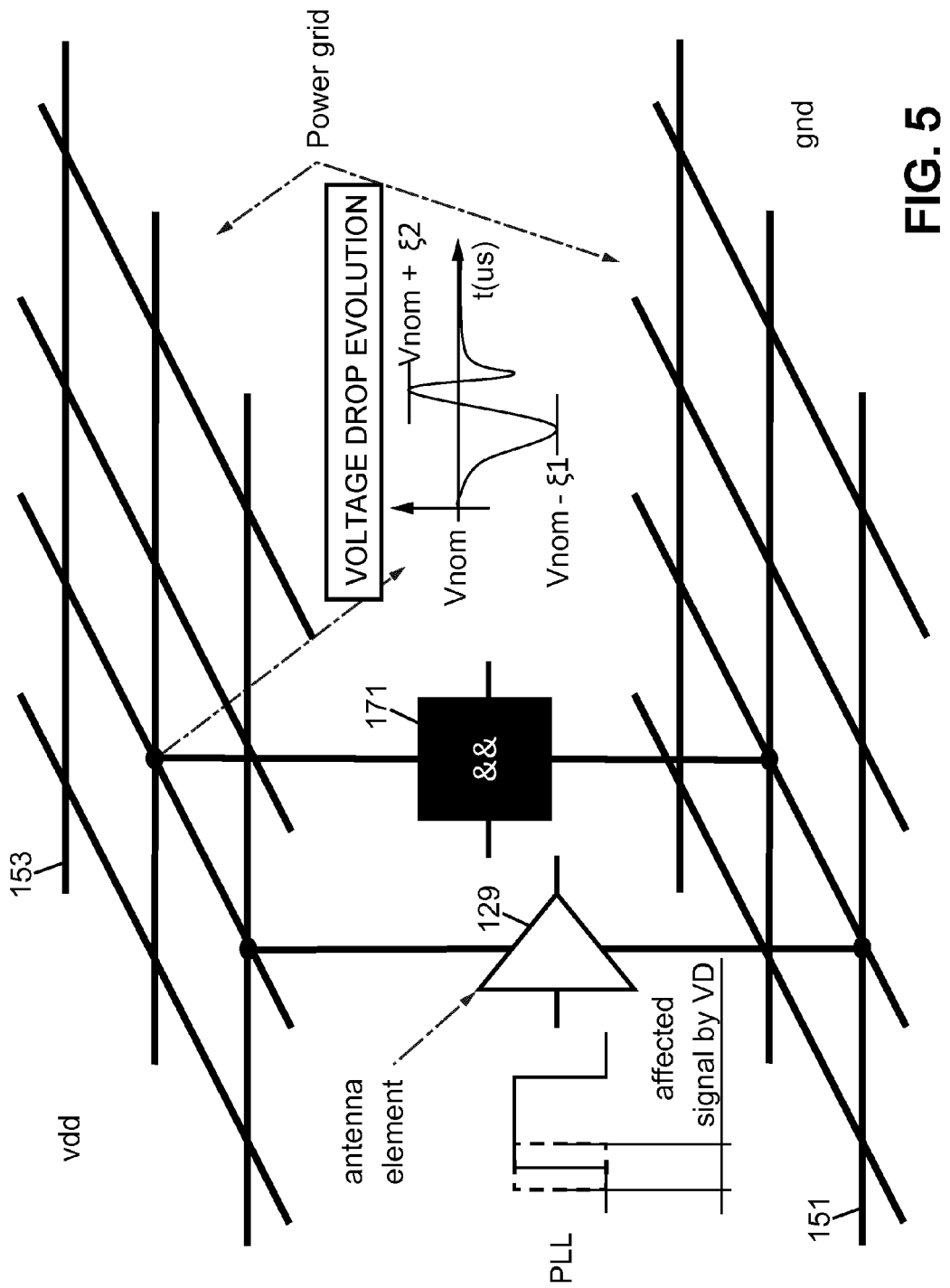
FIG. 5 illustrates a typical scenario of an implementation of an embodiment.

FIG. 5 illustrates a typical scenario in which the described embodiment can be put to use. Typically, in an integrated circuit comprising many electronic components, the components will have electrical connections to convey signals between the various components, and also electrical connections to provide power to each component. As illustrated in FIG. 5, an electrical component 171, such as a logic gate, has power supply connections to ground 151 and to a voltage supply 153. Since there are generally many electrical components 171 in an integrated circuit, the ground 151 and voltage supply 153 connections each take the form of a grid or mesh of electrical conductors. Each electrical component 171 is connected to nodes in the ground 151 mesh and the power supply 153 mesh. By providing electrical power to the buffers 129 that form the antenna 127 from nodes in the same mesh for the ground 151 and voltage supply 153, it can be ensured that the buffers 129 experience the same supply voltage, including any noise, as experienced by the electronic components 171 of the integrated circuit.

FIG. 5 also illustrates a typically observed supply voltage fluctuation that can be caused by activity in the electronic component 171. As can be seen from the figure, when the electrical component is idle, i.e. not switching, the power supply voltage is at some nominal value, $V_{nom}$. When some activity occurs in the electronic component, the power supply voltage drops, in this case to $(V_{nom}-\xi_1)$ since power is consumed by the activity of the component 171. Once the activity ceases, the supply voltage will rise towards $V_{nom}$. However, there is typically some overshoot and, as illustrated the supply voltage then rises to $(V_{nom}+\xi_2)$, before again falling below $V_{nom}$ and then eventually settling back to $V_{nom}$.

If the switching of the buffer 129, caused by input of a clock pulse to the buffer 129, occurs during a period when the supply voltage is equal to $V_{nom}$, then the delay in the buffer switching will have some nominal value. However, if the switching of the buffer 129 occurs when the supply voltage is below $V_{nom}$, then the switching of the buffer 129 will be delayed by an increased amount compared to the nominal value. Conversely, if the switching of the buffer 129 occurs when the supply voltage is above $V_{nom}$, then the switching of the buffer 129 will be delayed by a reduced amount compared to the nominal value. Thus, a timing variation in the buffer switching, and thereby propagation of the clock signal through the antenna 127, will be observed.

Figure 6:
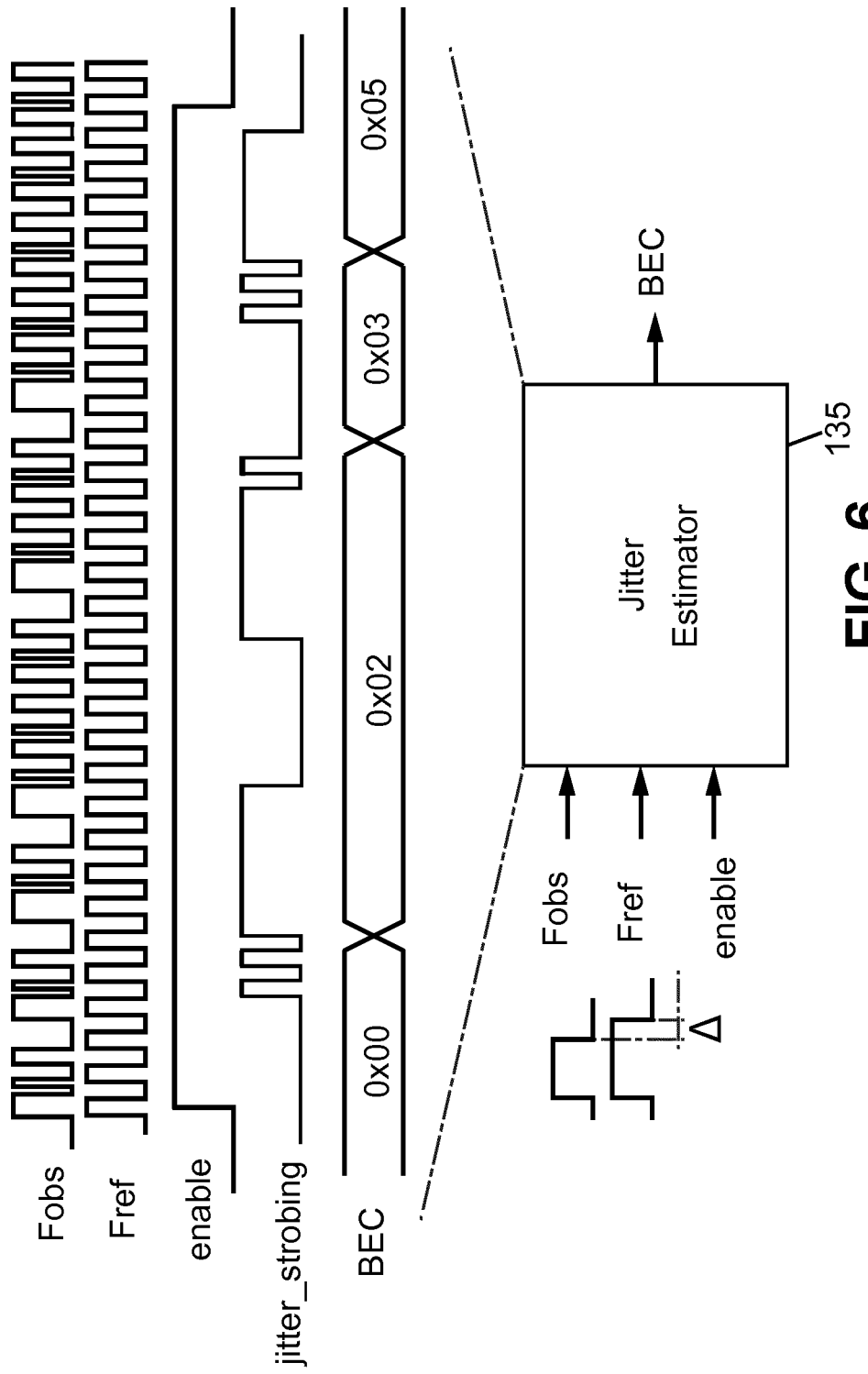
FIG. 6 illustrates a timing diagram for signals in the first embodiment.

The function of the AVS power supply control will now be described with reference to FIGS. 2-6. FIG. 6 illustrates an example timing diagram for input and output signals to the JE 135 in the integrated circuit 117 illustrated in FIG. 2. In the example timing diagram illustrated in FIG. 6, the trace labelled $F_{ref}$ corresponds to the signal input 137 to the JE 135 from either an ATE or another on-chip PLL. As can be seen from the figure, this corresponds to a normal square-pulse signal and, since the signal is provided by a PLL or external test equipment, the period of the clock pulse is regular to a high degree of accuracy, thus each square pulse in the trace is substantially identical to each other pulse.

In the example illustrated in FIG. 6, it is further assumed that the multiplexer 131 is switched such that the signal from the antenna 127 is output to the JE 135 as $F_{obs}$. Thus, the trace illustrated as $F_{obs}$ represents a clock pulse that was generated by the first PLL 123 and which was then propagated through the antenna 127. As is clear from the illustration of $F_{obs}$, this trace is less regular than the $F_{ref}$ trace. Since the signal from the $F_{obs}$ trace has propagated around the antenna 127, this signal has accumulated timing errors as a result of the small fluctuations in the local value of Vdd. The JE 135 is configured to compare the $F_{obs}$ signal with that of $F_{ref}$ to determine the relative jitter that is present on the $F_{obs}$ signal.

FIG. 6 also illustrates a schematic of the JE 135. In addition to the $F_{obs}$ and $F_{ref}$ inputs and the BEC output, the JE 135 also has an enable input. The enable input is used to enable the JE 135 for the purpose of performing noise measurements.

Typically, the clock frequency for a CPU can be of the order of 1 GHz, thus the clock period will be of the order of 1 ns. Jitter observed in $F_{obs}$ signal can typically be of the order of 50 ps in a given clock period. Thus, in the presence of jitter, the clock period observed on $F_{obs}$ can typically be between 0.95 ns and 1.05 ns for each buffer 129 in the antenna 127.

Estimations of jitter based on a system employing undersampling are provided in each of Huang JJ., et al, "*A Low-Cost Jitter Measurements Technique for BIST Applications*", ATS 2003, pp. 336-339, and S. Sunter and A. Roy, "*On-chip digital jitter measurement, from megahertz to gigahertz,*" IEEE Des. Test Comput., vol. 21, no. 4, pp. 314-321, July-August 2004.

A full description of the implementation of a jitter estimator is provided in H. Le-Gall, "Estimating of the jitter of a clock signal." U.S. Pat. No. 7,487,055, issued Feb. 3, 2009. Accordingly, a full description will not be provided here. However, in brief, the JE 135 uses an edge (either the rising edge or the falling edge) of each pulse in the $F_{ref}$ signal to trigger measurement of the $F_{obs}$ signal for a brief period. Thus, the $F_{obs}$ signal is sampled (or 'strobed') for a short window at regular intervals determined by the frequency of the $F_{ref}$ signal.

From the traces of $F_{ref}$ and $F_{obs}$ illustrated in FIG. 6, it can be seen that if there is no jitter present in the $F_{obs}$ signal, then sampling of the $F_{obs}$ signal at regular intervals will always result in the same result. In other words, in terms of the digital value, the sampled value will always be either high or low. However, if jitter is present in the $F_{obs}$ signal, then the regular sampling will sometimes result in a high output, and sometimes in a low output. This result is illustrated in the trace labelled 'jitter_strobing' in FIG. 6. As is clear from the jitter_strobing trace, the value of the jitter_strobing signal changes each time the result of the sampling changes, thus there are sometimes relatively long periods, when the jitter is small, in which the jitter counter either remains high or remains low.

The output from the JE 135 is in the form of a bus of 17 bits called a Beat Edge Counter (BEC). The output from the BEC is illustrated in the lowest trace in FIG. 6. As can be seen from the figure, the value of BEC corresponds to the number of timing uncertainties (jitter) between $F_{obs}$ and $F_{ref}$. Thus, each complete cycle in the jitter counter (rising edge to rising edge) results in the BEC being incremented by one. In other words, if there is exactly one rising edge and one falling edge on the $F_{obs}$ trace per cycle of the $F_{ref}$ trace, then there will be no increment of the BEC trace, otherwise, the BEC will be incremented.

To form the output of the BEC, $F_{obs}$ is sampled using $F_{ref}$ for a given time period, and is output, for example to a shift register, by the JE 135 in the form of a 17 bit binary word. This word can be used to estimate the magnitude of the PSN, and also to identify patterns in the PSN. Moreover, the values of the BEC can be correlated with activity in the CPU 101.

The BEC output of JE 135 used by the PMU 132 to modify the supply voltage to the CPU 101. Relation (1) below represents the dependency between voltage drop and power supply:

$$V_{min} = f(V_{drop}) \quad (1)$$

where the function f( ) can be interpreted as the average or the peak power consumption,
and $V_{min}$ is the minimum voltage at which the CPU 101 can be operated without significant timing errors.

The value of $V_{drop}$ can be calculated, for example, as the sum of undershoot and overshoot in a closed timing window (one related to the value of BEC).

The described embodiment employs a method based on the average value of $(\xi_1 + \xi_2)$ to fine-tune the power supply voltage by using the under-sampling technique implemented in the JE 135.

An example of a simple function of transposition for $V_{min\_avg}$ could read:

$$V_{min\_avg} = V_{nom} - [1/BEC_{act} - BEC_{ref} + \sigma)] \quad (2)$$

where:
$V_{min\_avg}$ is the minimal voltage determined as an average value
$V_{nom}$ is the nominal voltage supply;
$BEC_{act}$ is the timing variation measured during operation of the CPU 101 when there is processing activity on the CPU 101.
$BEC_{ref}$ is the timing variation measured when a sample, or 'target' application is running on the CPU 101, i.e. when there is no activity on the CPU 101; and,
$\sigma$ is the present voltage overshoot/undershoot variation, $(\xi_1 - \xi_2)$.

The basic start-up condition, when time=0, could be represented by:

$$iff:(\sigma == 0) => min(BEC_{ref}) = -1/V_{nom} \quad (3)$$

The basic idea behind this particular approach is to run a first set of stimuli (i.e., a 'target application') and store the obtained JE output (i.e., $BEC_{ref}$). This value will be later used as a reference. This first step is carried out offline, i.e., without any actual operations being executed by the chip. Then, when a given application runs and, depending on the related level of activity of the chip, the JE output $BEC_{act}$ can be lower or higher than the pre-computed reference BECref.

If $BEC_{act}$ is less than $BEC_{ref}$ then the PMU 132 can reduce the actual value of Vdd, which is the power supply voltage to the voltage domain 145, since this means that the actual application has a lower activity than the target application. Conversely, if $BEC_{act}$ is higher than $BEC_{ref}$ then the PMU 132 will increase Vdd to take account of the high activity level of the CPU 101 related to the current application.

Figure 7:
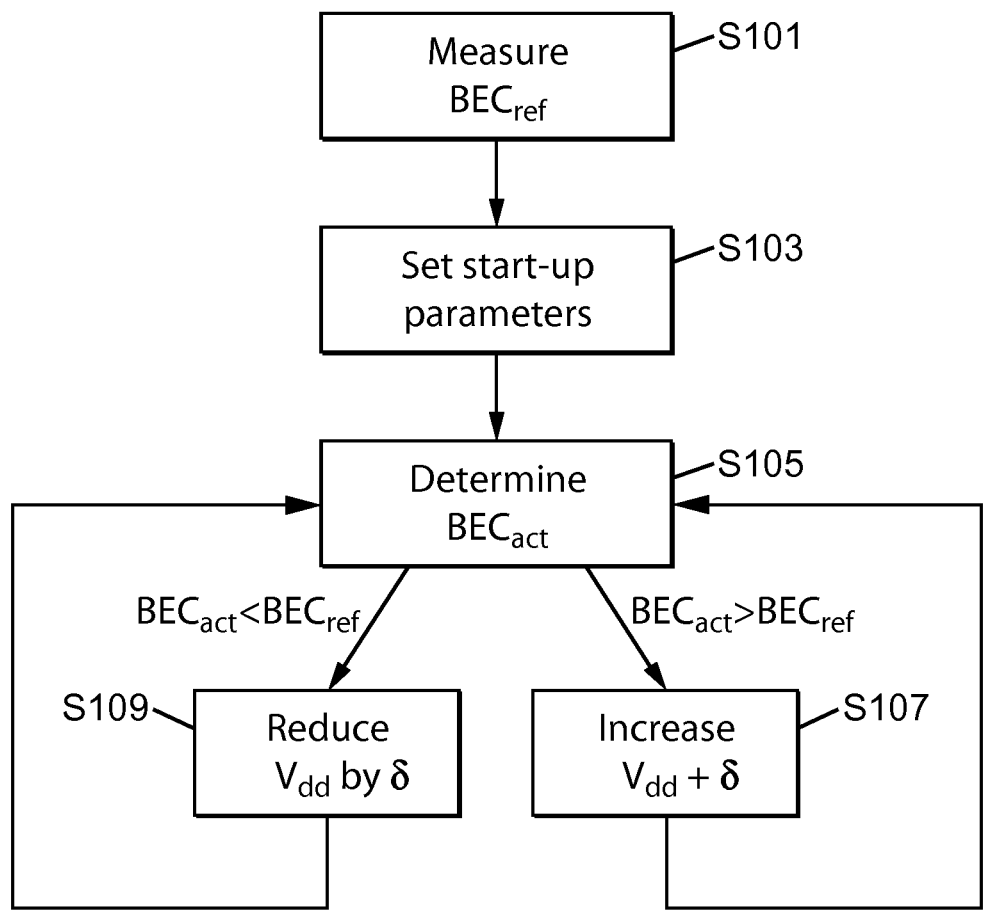
FIG. 7 illustrates a method according to the first embodiment.

This process is illustrated in FIG. 7. In step S101, the measure of $BEC_{ref}$ is obtained and stored, as described above, by measuring the BEC whist running a target application. The target application is a sample application, during which the CPU 101 carries out no operations.

In step S103, start-up parameters are determined and set as necessary.

In step S105, the CPU 101 commences running in a normal manner, execution an application. During this operation, a further determination of BEC is made, to derive the value of $BEC_{act}$. This value is then compared to the stored value of $BEC_{ref}$.

If $BEC_{act} > BEC_{ref}$ then, in step S107, the supply voltage $V_{dd}$ is increased by an amount, $\delta$. Conversely, if $BEC_{act} < BEC_{ref}$ then, in step S109, the supply voltage $V_{dd}$ is decreased by an amount, $\delta$.

Following either step S107 or S109, step S105 is repeated. Thus, the method provides a constant feedback mechanism to control the supply voltage $V_{dd}$ at an optimum level that varies with the activity of the CPU 101. The optimum level determined is the minimum voltage at which the CPU can be powered without causing timing errors at a level which would affect the performance of the CPU 101. Thus, the method provides a means to operate the CPU 101 at a minimum power consumption level.

Figure 8:
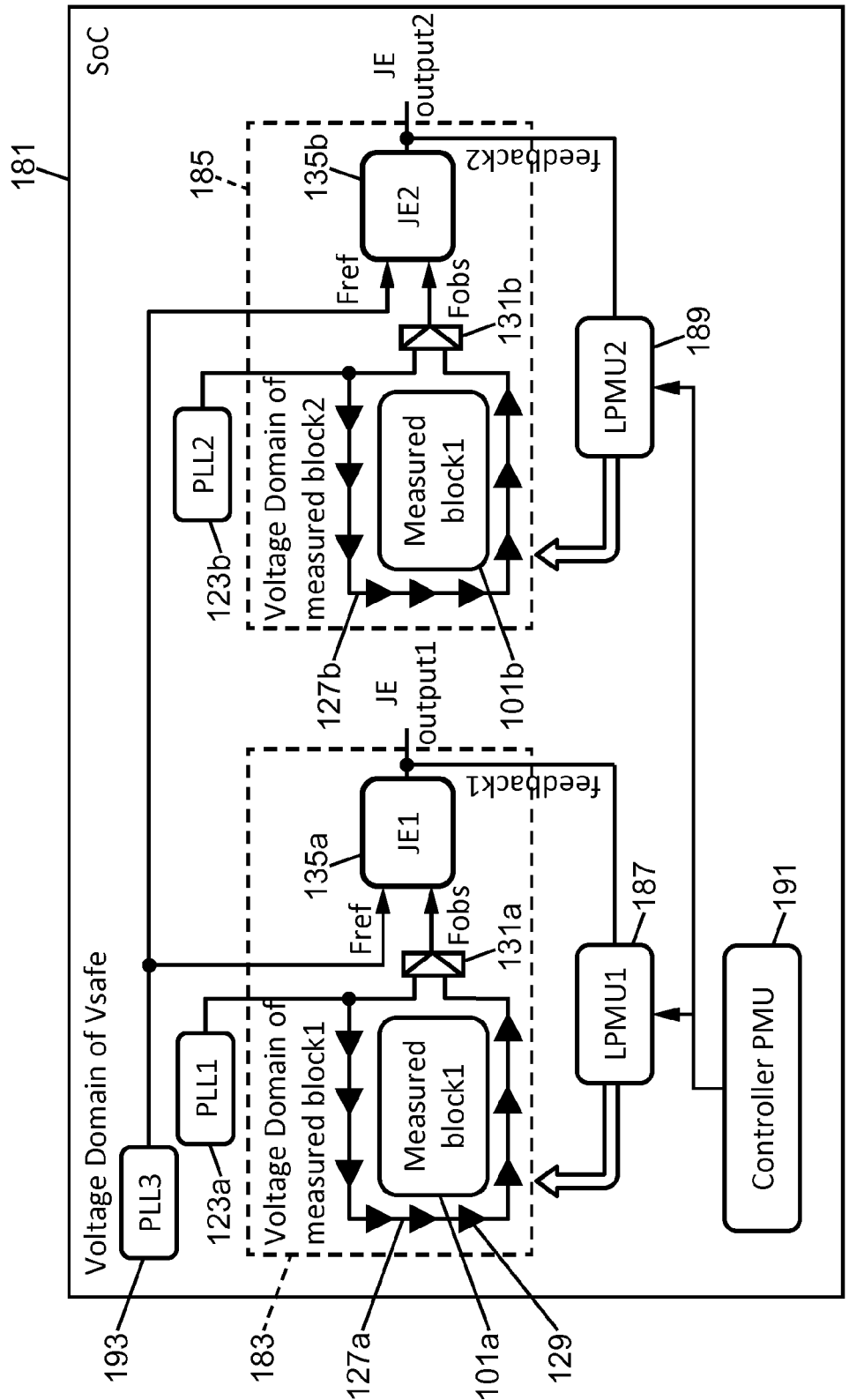
FIG. 8 illustrates a second embodiment.

A example of a second embodiment is illustrated in FIG. 8. In the illustrated embodiment, an integrated circuit 181 is composed of two functional blocks, 101*a* and 101*b*. Each functional block can, for example, be essentially identical to the CPU 101 discussed earlier in relation to FIG. 2. Thus, the second embodiment is directed to a situation where power supply control of two functional blocks within the same integrated circuit is effected.

Each functional block 101*a*, 101*b* has its own respective voltage domain 183 and 185 respectively. For each of the functional blocks 101*a* and 101*b*, there is a multiplexer 131*a*, 131*b*, a JE 135*a*, 135*b*, an antenna 127*a*, 127*b* and a PLL 123*a*, 123*b*. The structure, connections and function of the multiplexers 131*a*, 131*b*, JEs 135*a*, 135*b*, antennas 127*a*, 127*b* and PLLs 123*a*, 123*b* is essentially the same as described earlier in relation to FIG. 2. The locations of the components relative to their respective voltage domains are also essentially the same as described in relation to FIG. 2.

Replacing the PMU 132 of the first embodiment, each voltage domain 183, 185 has an associated local power management unit (LPMU), 187, 189. The LPMU 187 for the voltage domain 183 for the first functional block 101*a* is configured to provide feedback control to the voltage supply to that voltage domain 183. Similarly, the LPMU 189 for the voltage domain 185 for the second functional block 101*b* is configured to provide feedback control (adaptive voltage scaling, (AVS)) to the voltage supply to that voltage domain 185.

Controlling both the first and second LPMUs 187, 189 is a controller PMU (CPMU) 191. The CPMU 191 is configured such that it can activate or AVS on either or both of the first and second functional blocks 101*a*, 101*b*. In addition, the CPMU 191 can reprogram each of the reference points (Fref), and can activate different function of transposition, if desired.

In this embodiment, the reference frequency for both of the JEs 135*a*, 135*b* is provided by a reference PLL 193 situated outside of the voltage domain for either of the first functional block 101a or the second functional block 101b. Thus, the reference PLL 193 is independent of either voltage domain.

The skilled person will recognise that the embodiment of FIG. 8 provides essentially two duplicates of the embodiment described in relation to FIGS. 2-6. However, by providing a single reference PLL 193, and a single CPMU 191, some components can be shared. Thus, in the embodiment of FIG. 8, each functional block 101a, 101b can be controlled independently in the manner described in relation to FIGS. 2-6, yet some common components can be shared.

The skilled person will recognise that the embodiment of FIG. 8 can be extended to encompass control of more than two functional blocks. Thus, essentially any number (or all) of functional blocks on an integrated circuit can be controlled by extension of the embodiment of FIG. 8.

In further embodiments, rather than comparing $BEC_{act}$ with a single value of $BEC_{ref}$, two reference values of BEC are employed, $BEC_{ref1}$ and $BEC_{ref2}$. In such embodiments, the two reference values of BEC are set, with $BEC_{ref1}$ set to a point below the desired BEC value, and $BEC_{ref2}$ set above the desired BEC value. The power supply voltage is then increased if $BEC_{act} < BEC_{ref1}$, and decreased if $BEC_{act} > BEC_{ref2}$. By controlling the power supply in such a manner, rapid fluctuations in the power supply voltage can be avoided.

The present invention can also be embodied in a computer program product, which comprises all the features enabling the implementation of the methods described herein, and which—when loaded in an information processing system—is able to carry out these methods. Computer program means or computer program in the present context mean any expression, in any language, code or notation, of a set of instructions intended to cause a system having an information processing capability to perform a particular function either directly or after conversion to another language. Such a computer program can be stored on a computer or machine readable medium allowing data, instructions, messages or message packets, and other machine readable information to be read from the medium. The computer or machine readable medium may include non-volatile memory, such as ROM, Flash memory, Disk drive memory, CD-ROM, and other permanent storage. Additionally, a computer or machine readable medium may include, for example, volatile storage such as RAM, buffers, cache memory, and network circuits. Furthermore, the computer or machine readable medium may comprise computer or machine readable information in a transitory state medium such as a network link and/or a network interface, including a wired network or a wireless network, that allow a device to read such computer or machine readable information.

Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in be a reference to the plural and vice versa.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the invention as broadly defined above.

A person skilled in the art will readily appreciate that various parameters disclosed in the description may be modified and that various embodiments disclosed and/or claimed may be combined without departing from the scope of the invention.

The invention claimed is:

1. A device for controlling a power supply for a functional block in an integrated circuit, the device comprising:
    a signal generator configured to provide a clock signal to the functional block,
    an antenna comprising a transistor, and being located proximate to the functional block, the antenna being configured to receive the clock signal from the signal generator, and wherein
    the transistor of the antenna receives electrical power from the power source of the functional block,
    means to measure the clock signal output from the antenna and to output a control signal, and
    feedback means to control the voltage of the power supply to the functional block based on the control signal.

2. A device according to claim 1, wherein the antenna comprises a buffer, the buffer comprising a plurality of transistors configured to relay the clock signal from an input of the buffer to an output of the buffer.

3. A device according to claim 2, wherein the antenna comprises a plurality of buffers electrically connected in a daisy-chain fashion, whereby the output of buffers in the daisy-chain are connected to the input of the subsequent buffer in the daisy-chain.

4. A device according to claim 2, wherein the power to the, or each, transistor in the antenna is taken from a mesh of electrical contacts that also provides electrical power to one or more components within the functional block.

5. A device according to claim 1, wherein the means to measure the clock signal comprises a jitter estimator measuring timing errors between the clock signal output from the antenna and a reference clock signal.

6. A device according to claim 1, wherein the functional block, antenna and means to measure the clock signal are all located within a voltage domain, and wherein a common power source supplies power to the voltage domain.

7. A device according to claim 1, wherein the antenna is formed as a part of the functional block.

8. A device according to claim 5, wherein the feedback means is configured to increase the voltage output from the power supply to the functional block if the measured timing error is above a reference timing error, and to decrease the voltage output from the functional block if the measured timing error is below the reference timing error.

9. A device according to claim 8, wherein the reference timing error is determined by measuring the timing error from the antenna resulting from running a reference instruction set in the functional block.

10. A device according to claim 5, further comprising a multiplexer, wherein the multiplexer is configured to selectably transfer either the clock signal from the signal generator, or the signal output from the antenna, to the jitter estimator.

11. A device according to claim 5, wherein the reference clock signal is provided by the signal generator.

12. A device according to claim 8, wherein the feedback means is configured to provide feedback during execution of processing instructions on the functional block, to thereby maintain the power supply voltage at the minimum level that results in the timing error from the antenna being equal to the reference timing error.

13. A method for controlling a power supply for a functional block in an integrated circuit, the method comprising:
   providing a clock signal to the functional block,
   providing detection means comprising a transistor, located proximate to the functional block, the detection means being configured to receive the clock signal, and wherein the transistor of the detection means receives electrical power from the same power source that delivers power to the functional block,
   measuring the clock signal output from the detection means, and outputting a control signal, and
   providing feedback to control the voltage of the power supply to the functional block on the basis of the control signal.

14. A computer program product providing computer readable instructions which, when executed on a processor performs the method of claim 13.

15. A computer readable medium comprising the computer program product of claim 14.

* * * * *